(12) United States Patent
Matsubara

(10) Patent No.: US 10,312,913 B2
(45) Date of Patent: Jun. 4, 2019

(54) LEVEL SHIFTER

(71) Applicant: KABUSHIKI KAISHA TOKAI-RIKA-DENKI-SEISAKUSHO, Aichi-ken (JP)

(72) Inventor: Junichi Matsubara, Aichi-ken (JP)

(73) Assignee: KABUSHIKI KAISHA TOKAI-RIKA-DENKI-SEISAKUSHO, Aichi-ken (JP)

(*) Notice: Subject to any disclaimer, the term of this patent is extended or adjusted under 35 U.S.C. 154(b) by 0 days.

(21) Appl. No.: 15/722,449

(22) Filed: Oct. 2, 2017

(65) Prior Publication Data
US 2018/0109260 A1    Apr. 19, 2018

(30) Foreign Application Priority Data
Oct. 17, 2016  (JP) .................. 2016-203701

(51) Int. Cl.
*H03K 19/08* (2006.01)
*H03K 19/003* (2006.01)
(Continued)

(52) U.S. Cl.
CPC ......... *H03K 19/0813* (2013.01); *H03K 5/082* (2013.01); *H03K 19/00307* (2013.01);
(Continued)

(58) Field of Classification Search
CPC ....... H03K 19/0813; H03K 19/017518; H03K 19/017527; H03K 5/082; H03K 5/086; H03K 5/02337; H03K 3/02337
See application file for complete search history.

(56) References Cited

U.S. PATENT DOCUMENTS 4,438,349 A * 3/1984 Shoji .................... H03K 5/2481
                                                                327/73
4,634,897 A * 1/1987 Yoshioka ........... H03K 3/02337
                                                                327/65
(Continued)

FOREIGN PATENT DOCUMENTS

JP       H07-95041 A    4/1995
JP       2013-085016 A  5/2013
(Continued)

OTHER PUBLICATIONS

Extended European Search Report issued in the corresponding EP application No. 17195121.3 dated Mar. 1, 2018.
(Continued)

*Primary Examiner* — Thomas J. Hiltunen
(74) *Attorney, Agent, or Firm* — Roberts Mlotkowski Safran Cole & Calderon, P.C.

(57) ABSTRACT

The present disclosure provides a level shifter including: a level shifter section that is driven by a first power source voltage, and that, in accordance with switching of an input signal of a voltage lower than the first power source voltage, switches an output signal that has been level-shifted, from the first power source voltage to a voltage lower than the first power source voltage; and a threshold voltage changing circuit that, in accordance with a switching direction of the input signal, changes a threshold voltage of the input signal for switching the output signal.

5 Claims, 3 Drawing Sheets

(51) Int. Cl.
  *H03K 19/018* (2006.01)
  *H03K 5/08* (2006.01)
  *H03K 19/0175* (2006.01)
  *H03K 19/0944* (2006.01)
  *H03K 3/0233* (2006.01)

(52) U.S. Cl.
  CPC . *H03K 19/00315* (2013.01); *H03K 19/01831* (2013.01); *H03K 19/017518* (2013.01); *H03K 3/02337* (2013.01); *H03K 19/0944* (2013.01)

(56) References Cited

U.S. PATENT DOCUMENTS

| | | | | |
|---|---|---|---|---|
| 4,786,830 | A * | 11/1988 | Foss | H03K 3/3565 326/103 |
| 5,075,579 | A * | 12/1991 | Ueno | H03K 19/01752 326/17 |
| 5,162,671 | A * | 11/1992 | Ishihara | H03K 3/02337 327/205 |
| 5,495,186 | A | 2/1996 | Kanazawa et al. | |
| 5,502,406 | A | 3/1996 | Traynor et al. | |
| 5,656,957 | A * | 8/1997 | Marlow | H03K 3/02337 327/205 |
| 5,666,068 | A * | 9/1997 | Ehmann | H03K 3/3565 326/63 |
| 5,739,705 | A * | 4/1998 | John | G05F 3/267 327/205 |
| 5,790,060 | A * | 8/1998 | Tesch | H03M 1/089 341/119 |
| 5,808,496 | A * | 9/1998 | Thiel | H03K 3/3565 327/206 |
| 6,147,540 | A * | 11/2000 | Coddington | H03K 19/0027 327/333 |
| 6,518,790 | B2 * | 2/2003 | Wada | H01L 27/088 257/E27.06 |
| 6,940,318 | B1 | 9/2005 | Wong | |
| 7,109,761 | B2 * | 9/2006 | Isomura | H03K 3/02337 327/321 |
| 7,276,953 | B1 * | 10/2007 | Peng | H03K 19/01852 326/63 |
| 7,724,101 | B2 * | 5/2010 | Guerreiro | H03B 5/32 331/109 |
| 7,830,182 | B2 * | 11/2010 | Suzuki | H03K 5/2472 327/50 |
| 8,368,429 | B2 * | 2/2013 | Ueno | H03K 5/1532 327/206 |
| 9,007,100 | B2 * | 4/2015 | Asam | H03K 19/01852 327/108 |
| 2004/0174201 | A1 * | 9/2004 | Roberts | H03K 19/0027 327/333 |
| 2006/0214720 | A1 * | 9/2006 | Sobue | H03K 3/02337 327/359 |
| 2008/0224676 | A1 | 9/2008 | Kudo et al. | |
| 2009/0009217 | A1 * | 1/2009 | Huitsing | H03K 19/0027 326/68 |

FOREIGN PATENT DOCUMENTS

| | | |
|---|---|---|
| JP | 5465548 B2 | 4/2014 |
| WO | 2005/071838 A1 | 8/2005 |

OTHER PUBLICATIONS

Japanese Office Action issued in corresponding Japanese Application No. 2016-203701 dated Jul. 24, 2018.

* cited by examiner

LEVEL SHIFTER

CROSS-REFERENCE TO RELATED APPLICATION

This application claims priority under 35 USC 119 from Japanese Patent Application No. 2016-203701, filed on Oct. 17, 2016, the disclosure of which is incorporated by reference herein.

BACKGROUND

Technical Field

The present disclosure relates to a level shifter.

Related Art

Japanese Patent Application Publication (JP-B) No. 5465548 discloses a level shifter that transforms a high voltage supplied from a vehicle mounted battery into a low voltage which is usable in an engine control unit (ECU) or the like. A level shifter section is included in the level shifter. In the level shifter section, in a case in which an input signal is input, an output signal that has been level-shifted from a high voltage to a low voltage is output.

The above level shifter is configured such that, in a case in which an input signal has been input and has reached a specific threshold voltage, an output signal switches immediately in accordance with switching of the input signal. For example, in a case in which an input signal has switched from a low level to a high level and a threshold voltage has been reached, the output signal immediately switches from a low level to a high level. Conversely, in a case in which the input signal has switched from a high level to a low level and the threshold voltage has been reached, the output signal immediately switches from a high level to a low level. Thus, in a case in which noise occurs in the input signal, the output signal may erroneously switch in accordance with the input signal carrying the noise. There has been room for improvement with regard to preventing malfunctions in such level shifters.

SUMMARY

The present disclosure provides a level shifter that may improve noise tolerance and may prevent malfunctions.

A first aspect of the present disclosure is a level shifter including: a level shifter section that is driven by a first power source voltage, and that, in accordance with switching of an input signal of a voltage lower than the first power source voltage, switches an output signal that has been level-shifted, from the first power source voltage to a voltage lower than the first power source voltage; and a threshold voltage changing circuit that, in accordance with a switching direction of the input signal, changes a threshold voltage of the input signal for switching the output signal.

The level shifter according to the first aspect is configured including the level shifter section. The level shifter section is driven by the first power source voltage, and, in accordance with switching of the input signal of a voltage lower than the first power source voltage, switches the output signal that has been level-shifted from the first power source voltage to a voltage lower than the first power source voltage.

Here, the level shifter includes the threshold voltage changing circuit in addition to the level shifter section. In accordance with the switching direction of the input signal, the threshold voltage changing circuit changes the threshold voltage of the input signal for switching the output signal.

For example, a first threshold voltage is set by the threshold voltage changing circuit for when the input signal is switching from a low level to a high level, and the output signal is switched from a low level to a high level when the input signal reaches the first threshold voltage. Further, a second threshold voltage lower than the first threshold voltage is set by the threshold voltage changing circuit for when the input signal is switching from a high level to a low level, and the output signal is switched from a high level to a low level when the input signal reaches the second threshold voltage. Thus, in the threshold voltage changing circuit, a permissible range (the first threshold voltage-the second threshold voltage) proportionate to the noise generated in the input signal can be generated for the threshold voltage, enabling the output signal to be prevented from switching within the permissible range.

In a second aspect of the present disclosure, in the level shifter according to the first aspect, the threshold voltage changing circuit may be a hysteresis circuit exhibiting hysteresis characteristics with respect to changes in a voltage of the output signal in response to changes in the voltage of the input signal.

The level shifter according to the second aspect may enable the threshold voltage changing circuit to be implemented simply, by using a hysteresis circuit.

In a third aspect of the present disclosure, in the level shifter according to the first or the second aspect, the level shifter section may include: a differential amplifier circuit including: a first transistor having a first main electrode connected to the first power source voltage, a second main electrode connected to a second power source voltage of a voltage lower than the first power source voltage, and a first control electrode connected via a resistor to an input terminal to which the input signal is input, a second transistor having a third main electrode connected to the first power source voltage and a fourth main electrode connected to a second control electrode of the second transistor and to an output terminal where the output signal is output, and a third transistor having a first electrical conductivity type and having a fifth main electrode connected to the fourth main electrode and the output terminal and a sixth main electrode connected to the second power source voltage; and a current mirror circuit including: the third transistor, and a fourth transistor having the first electrical conductivity type and having a seventh main electrode connected to the first power source voltage, an eighth main electrode connected to the second power source voltage, and a fourth control electrode connected to a third control electrode of the third transistor.

In the level shifter according to the third aspect, the level shifter section is implemented by the differential amplifier circuit and the current mirror circuit. The differential amplifier circuit is configured including the first transistor, the second transistor, and the third transistor. The first transistor has the first main electrode connected to the first power source voltage, the second main electrode connected to the low-voltage second power source voltage, and the first control electrode connected to the input terminal via the resistor. The second transistor has the third main electrode connected to the first power source voltage and the fourth main electrode connected to the second control electrode and the output terminal. The third transistor has the fifth main electrode connected to the fourth main electrode and the output terminal, and the sixth main electrode connected to the second power source voltage. The third transistor is configured with the first electrical conductivity type. The current mirror circuit is configured including the third transistor and the fourth transistor. The fourth transistor has the seventh main electrode connected to the first power source voltage, the eighth main electrode connected to the second power source voltage, and the fourth control electrode connected to the third control electrode of the third transistor. The fourth transistor is configured with the same electrical conductivity type as the third transistor.

In a fourth aspect of the present disclosure, in the level shifter of the third aspect, the threshold voltage changing circuit may include: a constant current source having an input connected to the first power source voltage; a fifth transistor having the first electrical conductivity type and having a ninth main electrode connected to an output of the constant current source, a tenth main electrode connected to the second power source voltage, and a fifth control electrode connected to a node between the output terminal, and the fourth main electrode and the fifth main electrode; and a sixth transistor having a second electrical conductivity type opposite to that of the first electrical conductivity type and having an eleventh main electrode connected to the fourth main electrode, a twelfth main electrode connected to the fifth main electrode and the output terminal, and a sixth control electrode connected to a node between the output of the constant current source and the ninth main electrode.

In the level shifter according to the fourth aspect, the threshold voltage changing circuit is configured including the constant current source, the fifth transistor, and the sixth transistor. In constant current source, the input is connected to the first power source voltage. In the fifth transistor, the ninth main electrode is connected to the output of the constant current source, the tenth main electrode is connected to the second power source voltage, and the fifth control electrode is connected to a node between the output terminal, and fourth main electrode and the fifth main electrode. The fifth transistor is configured with the first electrical conductivity type. In the sixth transistor, the eleventh main electrode is connected to the fourth main electrode, the twelfth main electrode is connected to the fifth main electrode and to the output terminal, and the sixth control electrode is connected to a node between the output of the constant current source and the ninth main electrode of the fifth transistor. The sixth transistor is configured with the second electrical conductivity type opposite to that of the first electrical conductivity type. Thus, in the threshold voltage changing circuit, the permissible range of the threshold voltage (the voltage difference between the first threshold voltage and the second threshold voltage) is set by the ON-state resistance characteristics of the fifth transistor and the sixth transistor. Accordingly, the fourth aspect may enable variability in the permissible range to be lessened, and may improve precision in the switching of the output signal.

In a fifth aspect of the present disclosure, in the level shifter according to the fourth aspect, the constant current source and the sixth transistor may be configured by an offset transistor, and the fifth transistor may be configured by a vertical diffused transistor.

In the level shifter according to the fifth aspect, the offset transistor and the vertical diffused transistor are both transistors having high withstand voltages. Therefore, level shifting can be achieved from, for example, a high voltage power source of a vehicle mounted battery installed in a vehicle such an automobile, to a low voltage usable by an ECU or the like.

A sixth aspect of the present disclosure, in the level shifter of any one of the first aspect to the fifth aspect, may further include a clamp section that limits the amplitude of the output signal.

In the level shifter according to the sixth aspect, a clamp section is provided to the level shifter section, and the amplitude of the output signal is limited by the clamp section. Accordingly, the sixth aspect may implement a level shifter with highly reliable operation, since damage and breakdown of next-stage circuits of the level shifter section may be prevented.

According to the above aspects, the level shifter of the present disclosure may improve noise tolerance and may prevent malfunctions.

BRIEF DESCRIPTION OF THE DRAWINGS

Exemplary embodiments will be described in detail based on the following figures, wherein.

DETAILED DESCRIPTION

Figure 1:
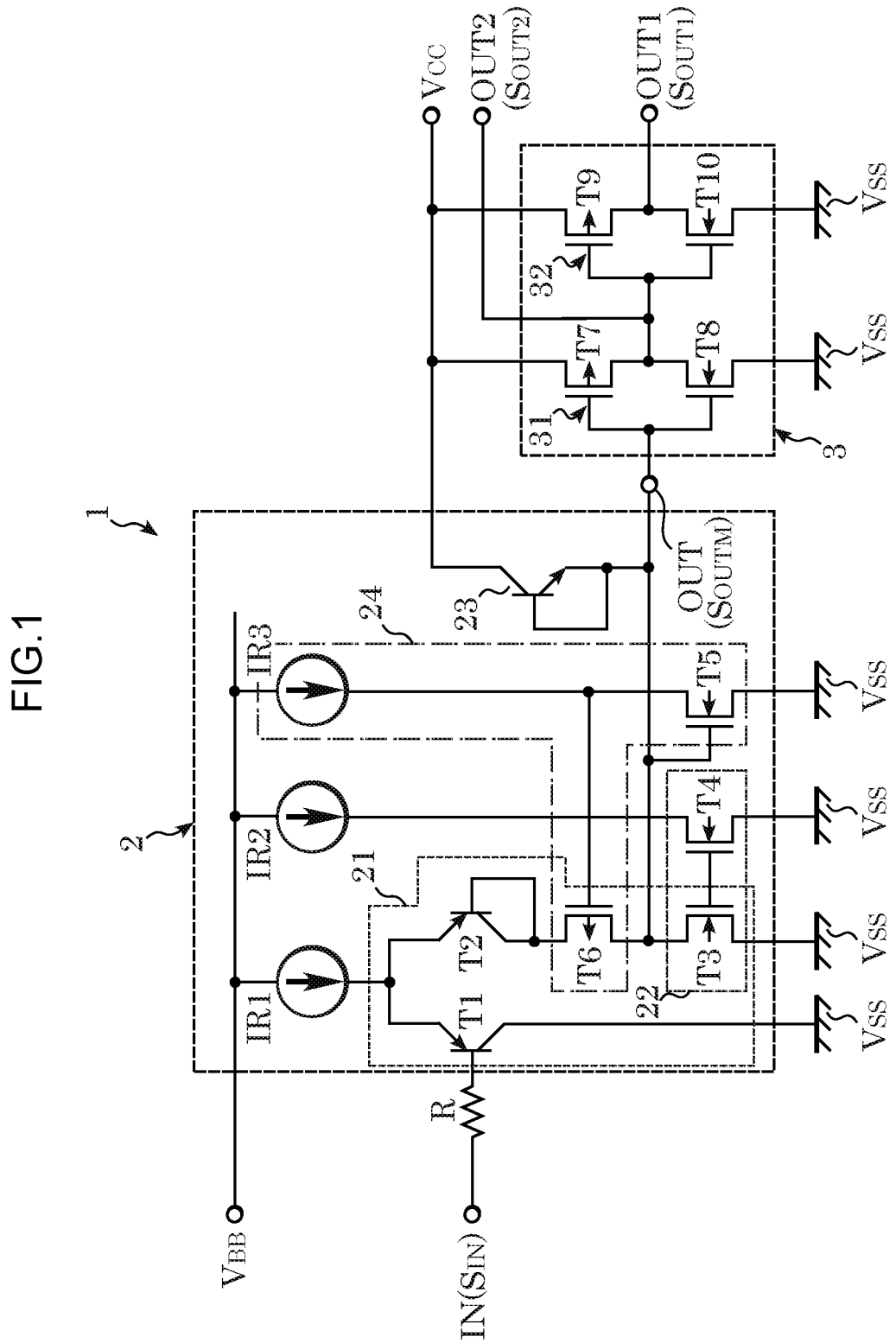
FIG. 1 is a circuit diagram of a level shifter according to an exemplary embodiment of the present disclosure.

A level shifter according to an exemplary embodiment of the present disclosure will be described below with reference to FIG. 1 to FIG. 4. Note that, in the present exemplary embodiment, elements having the same function or substantially the same function are allocated the same reference numeral and redundant description thereof is omitted.

As illustrated in FIG. 1, a level shifter 1 according to the present exemplary embodiment is driven by a high-voltage first power source voltage $V_{BB}$ supplied from a vehicle mounted battery. The level shifter 1 is configured of a level shifter section 2 and a buffer section 3. In the level shifter 1, output signals $S_{OUT1}$ and $S_{OUT2}$ that have been level-shifted from a first power source voltage $V_{BB}$ to lower voltages are output in accordance with an input signal $S_{IN}$ having a voltage lower than the first power source voltage $V_{BB}$.

The first power source voltage $V_{BB}$ is, for example, from 8 V to 18 V. The input signal $S_{IN}$ is, for example, a signal that rises from 0 V (low level) to 6 V (high level) or a signal that falls from 6 V to 0 V. The output signals $S_{OUT1}$ and $S_{OUT2}$ are, for example, signals that step up from 0 V (low level) to 5 V (high level) or signals that step down from 5 V to 0 V. The output signal $S_{OUT2}$ is an inverted signal of the output signal $S_{OUT1}$. Here, a second power source voltage $V_{SS}$ is 0 V.

The level shifter section 2 of the level shifter 1 includes main configuration of a differential amplifier circuit 21, a current mirror circuit 22, and a clamp section 23. Further, the level shifter section 2 includes a threshold voltage changing circuit 24.

The differential amplifier circuit 21 is configured including a first transistor T1, a second transistor T2, and a third transistor T3. The first transistor T1 is configured by a pnp-type bipolar transistor. In the first transistor T1, an emitter electrode serving as a first main electrode is connected to the first power source voltage $V_{BB}$ via a constant current source IR1, and a collector electrode serving as a second main electrode is connected to the second power source voltage $V_{SS}$. A base electrode serving as a first control electrode of the first transistor T1 is connected to an input terminal IN via a resistor (input resistor) R. The input signal $S_{IN}$ is input to the input terminal IN.

The second transistor T2 is configured by a pnp-type bipolar transistor having the same structure to that of the first transistor T1. In the second transistor T2, an emitter electrode, serving as a third main electrode, is connected to the first power source voltage $V_{BB}$ via the constant current source IR1. A collector electrode, serving as a fourth main electrode of the second transistor T2, is connected to a base electrode, serving as a second control electrode of the second transistor T2, and to an output terminal OUT of the level shifter section 2, and is also connected to the second power source voltage $V_{SS}$ via a third transistor T3. An output signal $S_{OUTM}$ of the level shifter section 2 that has been level-shifted from the first power source voltage $V_{BB}$ to a lower voltage is output to the output terminal OUT.

The third transistor T3 is configured by an n-channel insulated gate field effect transistor (IGFET) that has n-type conductivity as a first electrical conductivity type. To describe in more detail, in the present exemplary embodiment, the third transistor T3 is configured by a vertical diffused metal oxide semiconductor field effect transistor (VDMOSFET) having a structure with a high withstand voltage. The vertical cross-sectional structure of the third transistor T3 is described later. In the third transistor T3, a drain electrode, serving a fifth main electrode, is connected to the collector electrode of the second transistor T2 and to the output terminal OUT, and a source electrode, serving as a sixth main electrode, is connected to the second power source voltage $V_{SS}$.

The current mirror circuit 22 is configured including the third transistor T3 and a fourth transistor T4. The fourth transistor T4 is configured by an n-channel IGFET having the same structure as the third transistor T3. In the fourth transistor T4, a drain electrode, serving as a seventh main electrode, is connected to the first power source voltage $V_{BB}$ via a constant current source IR2, and a source electrode, serving as an eighth main electrode, is connected to the second power source voltage $V_{SS}$. A gate electrode serving as a fourth control electrode of the fourth transistor T4 is connected to a gate electrode serving as a third control electrode of the third transistor T3.

The clamp section 23 is configured by an npn-type bipolar transistor. In this bipolar transistor, a collector electrode, serving as one main electrode, is connected to a third power source voltage $V_{CC}$. The third power source voltage $V_{CC}$ is a low voltage level that has been shifted from first power source voltage $V_{BB}$, and is, for example, 5 V. An emitter electrode, serving as another main electrode, and a base electrode, serving as a control electrode, are connected to a node between the output terminal OUT, and the collector electrode of the second transistor T2 and the drain electrode of the third transistor T3. The clamp section 23 limits the amplitude of the output signal $S_{OUTM}$, and is, for example, configured to limit the output signal $S_{OUTM}$ to 5.6V or less, such that the buffer section 3, which is a next-stage circuit, is not applied with an amplitude exceeding this limit.

The threshold voltage changing circuit 24 is provided within the level shifter section 2, and is configured including a constant current source IR3, a fifth transistor T5, and a sixth transistor T6. The threshold voltage changing circuit 24 is configured by a hysteresis circuit that exhibits hysteresis characteristics to changes in the voltage of the output signal $S_{OUTM}$ in response to changes in the voltage of the input signal $S_{IN}$. These hysteresis characteristics are described later. An input of the constant current source IR3 is connected to the first power source voltage $V_{BB}$. The constant current source IR3 is configured by the same structure as the other constant current sources IR1 and IR2, and is configured by a p-channel IGFET that has p-type conductivity as a second electrical conductivity type. To describe in more detail, in the present exemplary embodiment, in the present exemplary embodiment, the IGFET is configured by an offset metal oxide semiconductor field effect transistor (an offset MOSFET) having a structure with a high withstand voltage. The vertical cross-section structure of this IGFET is described later.

The fifth transistor T5 is configured by an n-channel IGFET having the same structure as the third transistor T3, and, more specifically, is configured by a VDMOSFET. In the fifth transistor T5, a drain electrode, serving as a ninth main electrode, is connected to an output of the constant current source IR3, and a source electrode, serving as a tenth main electrode, is connected to the second power source voltage $V_{SS}$. A gate electrode, serving as a fifth control electrode of the fifth transistor T5, is connected to a node between the output terminal OUT, and the collector electrode of the second transistor T2 and the drain electrode of the third transistor T3.

The sixth transistor T6 is configured by a p-channel IGFET having the same structure as the constant current source IR3, and, more specifically, is configured by an offset MOSFET. In the sixth transistor T6, a source electrode, serving as an eleventh main electrode, is connected to a collector electrode of the second transistor T2, and a drain electrode, serving as a twelfth main electrode, is connected to the drain electrode of the third transistor T3 and to the output terminal OUT. A gate electrode, serving as a sixth control electrode of the sixth transistor T6, is connected to a node between the output of the constant current source IR3 and the drain electrode of the fifth transistor T5.

In the present exemplary embodiment, the buffer section 3 is configured including a first inductor 31 and a second inductor 32, these being two stages electrically connected together in series. The first inductor 31 is configured including a seventh transistor T7 and an eighth transistor T8. To describe in more detail, the seventh transistor T7 is configured by a p-channel IGFET. A source electrode, serving as one main electrode of the seventh transistor T7, is connected to the third power source voltage $V_{CC}$, and a drain electrode, serving as another main electrode of the seventh transistor T7, is connected to an output terminal OUT2 of the buffer section 3. A gate electrode, serving as a control electrode of the seventh transistor T7, is connected to the output terminal OUT of the level shifter section 2. The eighth transistor T8 is configured by an n-channel IGFET. A source electrode, serving as one main electrode of the eighth transistor T8, is connected to the second power source voltage $V_{SS}$, and a drain electrode, serving as another main electrode of the eighth transistor T8, is connected to the output terminal OUT2. A gate electrode, serving as a control electrode of the eighth transistor T8, is connected to the output terminal OUT. In the first inductor 31, an output signal $S_{OUT2}$, which is inverted with respect to the output signal $S_{OUTM}$ of the level shifter section 2 output to the output terminal OUT, is output from the output terminal OUT2.

The second inductor 32 is configured including a ninth transistor T9 and a tenth transistor T10. The ninth transistor T9 is configured by a p-channel IGFET having the same structure as the seventh transistor T7. A source electrode, serving as one main electrode of the ninth transistor T9, is connected to the third power source voltage $V_{CC}$, and a drain electrode, serving as another main electrode of the ninth transistor T9, is connected to an output terminal OUT1. A gate electrode, serving as a control electrode of the ninth transistor T9, is connected to the output of the first inductor 31. The tenth transistor T10 is configured by an n-channel IGFET having the same structure as the eighth transistor T8. A source electrode, serving as one main electrode of the tenth transistor T10, is connected to the second power source voltage $V_{SS}$, and a drain electrode, serving as another main electrode of the tenth transistor T10, is connected to the output terminal OUT1. A gate electrode, serving as a control electrode of the tenth transistor T10, is connected to the output of the first inductor 31. In the second inductor 32, the output signal $S_{OUT1}$, which is inverted with respect to output signal $S_{OUT2}$ of the first inductor 31, is output from the output terminal OUT1.

Figure 2:
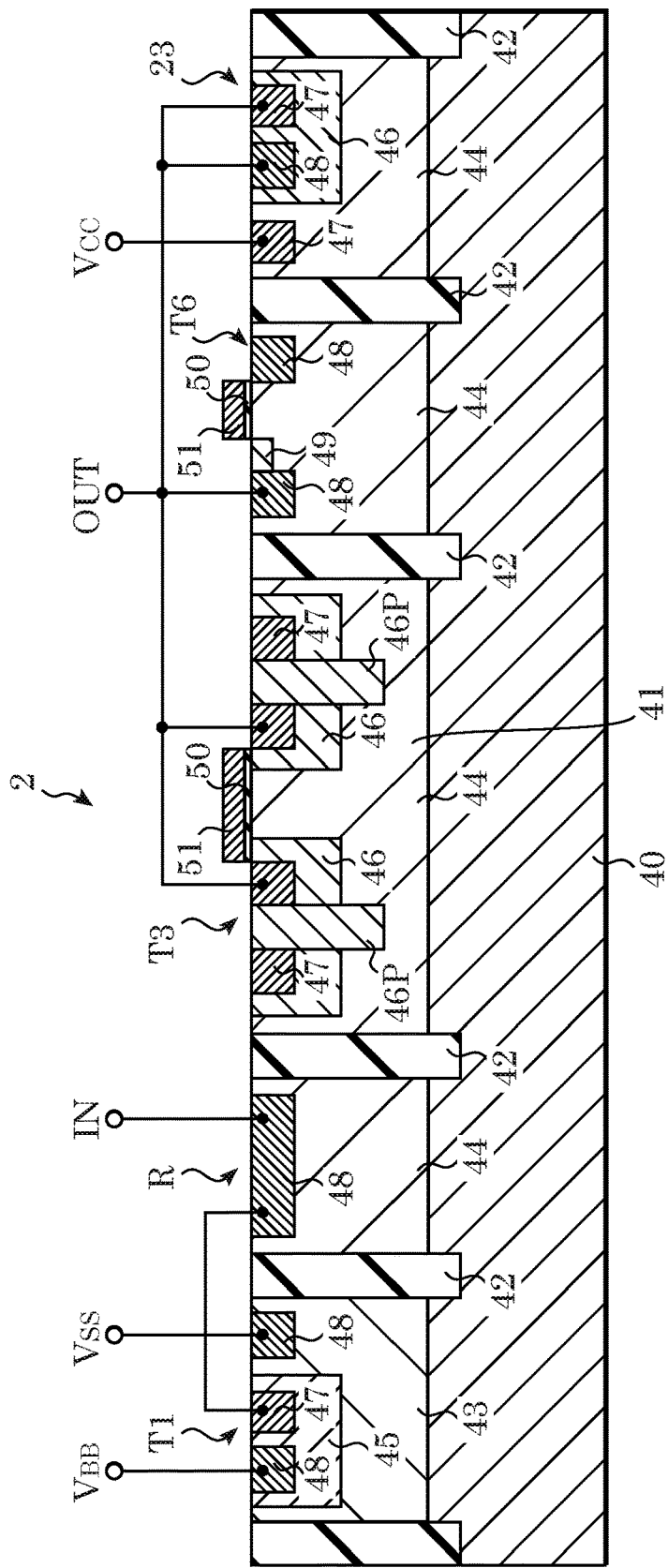
FIG. 2 is a vertical cross-sectional view illustrating a configuration of each element configuring a portion of a level shifter section and a threshold voltage changing circuit of the level shifter illustrated in FIG. 1.
Figure 3:
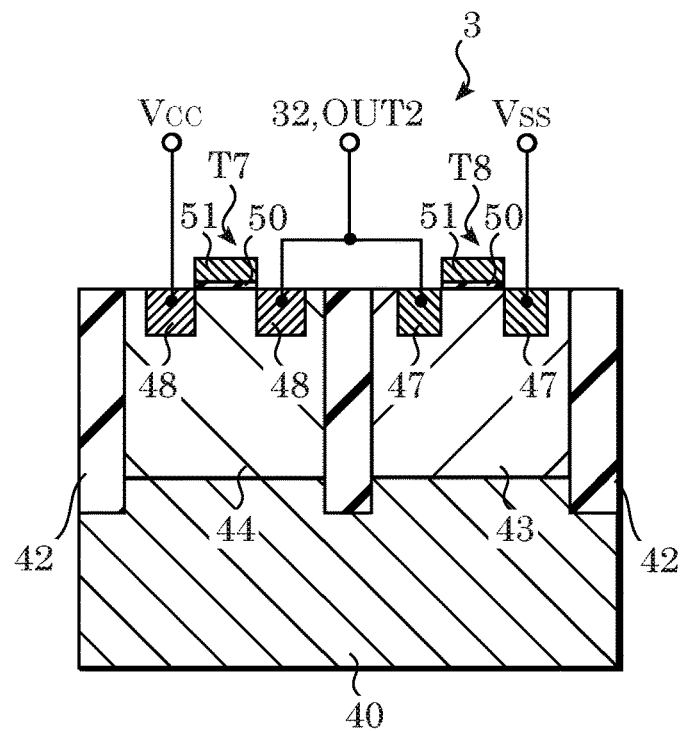
FIG. 3 is a vertical cross-sectional view corresponding to FIG. 2 illustrating a configuration of a buffer section of the level shifter illustrated in FIG. 1.

The level shifter 1 according to the present exemplary embodiment is configured as a semiconductor integrated circuit (a semiconductor device). As illustrated in FIG. 2 and FIG. 3, the level shifter 1 is formed with a semiconductor substrate 40 serving as a base. In the present exemplary embodiment, an n-type monocrystalline silicon substrate is employed as the semiconductor substrate 40.

As illustrated in FIG. 2, semiconductor elements of a first transistor T1 to a fourth transistor T4 of the level shifter section 2 and the npn-type bipolar transistor of the clamp section 23 are each formed in an epitaxial growth layer 41 formed on a main face of the semiconductor substrate 40. Each of these semiconductor elements is formed in the epitaxial growth layer 41, within a region whose surroundings are enclosed by element isolating regions 42.

The first transistor T1 is configured including a p-type well region 43 formed in the epitaxial growth layer 41, an n-type base region 45 formed in a main face section of the p-type well region 43, and a p-type semiconductor region 48 formed in a main face section of the n-type base region 45. The p-type well region 43 is employed as a collector electrode. The p-type well region 43 is connected to the second power source voltage $V_{SS}$ via the p-type semiconductor region 48 that serves as a well contact having a higher impurity concentration than the p-type well region 43. The n-type base region 45 is employed as a base electrode. The n-type base region 45 is connected to one end of a resistor R via an n-type semiconductor region 47 that serves as a base contact having a higher impurity concentration than the n-type base region 45. The p-type semiconductor region 48 is employed as an emitter electrode and is connected to the first power source voltage $V_{BB}$ via the constant current source IR1 illustrated in FIG. 1. The second transistor T2 is configured by the same vertical cross-section structure as the first transistor T1.

The resistor R is configured by a p-type semiconductor region 48 formed in a main face section of an n-type well region 44. The n-type well region 44 is formed in the epitaxial growth layer 41. One end of the resistor R is connected to the base electrode of the first transistor T1. Another end of the resistor R is connected to the input terminal IN.

The third transistor T3 is configured by a VDMOSFET in the present exemplary embodiment. To describe in more detail, as illustrated in FIG. 2, the third transistor T3 is configured including one main electrode (the sixth main electrode), a channel formation region, another main electrode (the fifth main electrode), a gate insulating film 50, and a gate electrode 51. The one main electrode is configured including an n-type well region 44. The impurity concentration of the n-type well region 44 is set lower than the impurity concentration of the semiconductor substrate 40. At an end portion of the gate electrode 51, the channel formation region is formed in the main face section of a p-type base region 46 formed in the main face section of the n-type well region 44. The p-type base region 46 is connected to a p-type semiconductor region 46P having a higher impurity concentration than the p-type base region 46. The other main electrode is configured by an n-type semiconductor region 47 formed in the main face section of the p-type base region 46, and is connected to the output terminal OUT. The gate electrode 51 is connected to a gate electrode 51 of the fourth transistor T4. The fourth transistor T4 is configured by the same vertical cross-sectional structure as the third transistor T3.

The bipolar transistor of the clamp section 23 is configured including an n-type well region 44, a p-type base region 46 formed in a main face section of the n-type well region 44, and an n-type semiconductor region 47 formed in the main face section of the p-type base region 46. The n-type well region 44 is employed as a collector electrode. The n-type well region 44 is connected to the third power source voltage $V_{CC}$ via the n-type semiconductor region 47, which serves as a well contact. The p-type base region 46 is employed as a base electrode. The p-type base region 46 is connected to the output terminal OUT via a p-type semiconductor region 48 that serves as a base contact. The n-type semiconductor region 47 is employed as an emitter electrode and is connected to the output terminal OUT.

On the other hand, as illustrated in FIG. 3, the seventh transistor T7 constructing the first inductor 31 of the buffer section 3 is formed in a main face section of an n-type well region 44 within a region whose surroundings are enclosed by element isolating regions 42. The seventh transistor T7 is configured including the n-type well region 44 serving as a channel formation region, a pair of p-type semiconductor regions 48 serving as one main electrode and another main electrode, a gate insulating film 50, and a gate electrode 51. The p-type semiconductor region 48 that serves as the one main electrode is connected to the third power source voltage $V_{CC}$. The p-type semiconductor region 48 that serves as the other main electrode is connected to the output terminal OUT2 and the gate electrode 51 of the next stage second inductor 32. The eighth transistor T8 constructing the first inductor 31 is formed in a main face section of a p-type well region 43 within a region whose surroundings are enclosed by element isolating regions 42. The eighth transistor T8 is configured including a p-type well region 43 serving as a channel formation region, a pair of n-type semiconductor regions 47 serving as one main electrode and another main electrode, a gate insulating film 50, and a gate electrode 51. The n-type semiconductor region 47 that serves as the one main electrode is connected to the second power source voltage $V_{SS}$. The n-type semiconductor region 47 that serves as the other main electrode is connected to the output terminal OUT2 and to the gate electrode 51 of the next stage second inductor 32.

The ninth transistor T9 constructing the second inductor 32 is configured by the same structure as the seventh transistor T7. The tenth transistor T10 constructing the second inductor 32 is configured by the same structure as the eighth transistor T8. The other main electrodes of the ninth transistor T9 and the tenth transistor T10 are each connected to the output terminal OUT1.

The fifth transistor T5 configuring the threshold voltage changing circuit 24 illustrated in FIG. 1 is configured by a VDMOSFET having the same vertical cross-sectional structure as the third transistor T3 illustrated in FIG. 2. Description of fifth transistor T5 is omitted since the structure is the same as the third transistor T3.

The sixth transistor T6 constructing the threshold voltage changing circuit 24 is configured by an offset MOSFET like that illustrated in FIG. 2. The sixth transistor T6 is formed in within a region whose surroundings are enclosed by element isolating regions 42, and is formed on a main face section of an n-type well region 44. The sixth transistor T6 is configured including the n-type well region 44 serving as a channel formation region, a pair of p-type semiconductor regions 48 serving as one main electrode (the eleventh main electrode) and another main electrode (the twelfth main electrode), a gate insulating film 50, and a gate electrode 51. The other main electrode is a p-type semiconductor region 48 disposed in a position offset from the gate electrode 51, and a p-type semiconductor region 49 having a lower impurity concentration than the impurity concentration of the p-type semiconductor region 48 is formed below the gate electrode 51 on the channel formation region side of this p-type semiconductor region 48.

Furthermore, the constant current source IR3 constructing the threshold voltage changing circuit 24 is configured by an offset MOSFET having the same vertical cross-section structure as the sixth transistor T6. Here, the constant current sources IR1 and IR2 of the level shifter section 2 illustrated in FIG. 1 are each configured by offset MOSFETs having the same vertical cross-section structures as the constant current source IR3.

As illustrated in FIG. 1, the level shifter 1 according to the present exemplary embodiment is configured including the level shifter section 2. The level shifter section 2 is driven by the first power source voltage $V_{BB}$, and switches the output signal $S_{OUTM}$, which has been level-shifted from the first power source voltage $V_{BB}$ to a voltage lower than the first power source voltage $V_{BB}$, in accordance with switching of the input signal $S_{IN}$ having a voltage lower than the first power source voltage $V_{BB}$.

Here, the level shifter 1 includes the threshold voltage changing circuit 24 in addition to the level shifter section 2. In accordance with the switching direction of the input signal $S_{IN}$, the threshold voltage changing circuit 24 changes the threshold voltage of the input signal $S_{IN}$ for switching the output signal $S_{OUTM}$.

Figure 4:
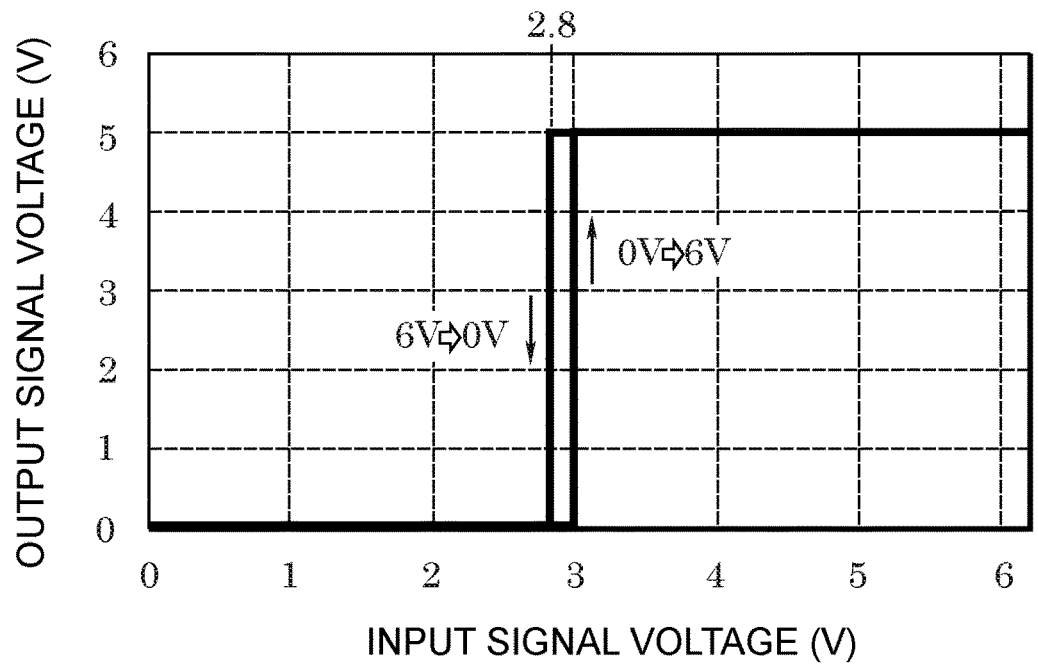
FIG. 4 is a characteristics plot illustrating an output signal in response to an input signal of the level shifter illustrated in FIG. 1.

FIG. 4 illustrates the output signal $S_{OUTM}$ in response to the input signal $S_{IN}$ performed in the threshold voltage changing circuit 24. The horizontal axis is voltage (V) of the input signal $S_{IN}$. The vertical axis is the voltage (V) of the output signal $S_{OUTM}$. A first threshold voltage of 3 V is set by the threshold voltage changing circuit 24 for a case in which the input signal $S_{IN}$ input to the input terminal IN of the level shifter section 2 is switching from 0 V to 6 V. This switches the output signal from 0 V to 5 V in a case in which the input signal $S_{IN}$ reaches the first threshold voltage. On the other hand, a second threshold voltage of 2.8 V, which is lower than the first threshold voltage, is set by the threshold voltage changing circuit 24 for a case in which the input signal $S_{IN}$ input to the input terminal IN is switching from 6 V to 0 V. This switches the output signal from 5 V to 0 V in a case in which the input signal $S_{IN}$ reaches the second threshold voltage.

Thus, in the threshold voltage changing circuit 24, since a permissible range (the first threshold voltage-the second threshold voltage) proportionate to the noise generated in the input signal $S_{IN}$ can be generated for the threshold voltage, switching of the output signal $S_{OUTM}$ within the permissible range may be prevented. In the above example, the permissible range is set to 0.2 V, and the output signal $S_{OUTM}$ does not switch even if noise is generated in the input signal $S_{IN}$ as long the noise is within this range. Accordingly, in the level shifter 1 according to the present exemplary embodiment, noise tolerance may be improved and malfunctions may be prevented.

As illustrated in FIG. 4, in the level shifter 1 according to the present exemplary embodiment, the threshold voltage changing circuit 24 is a hysteresis circuit that exhibiting hysteresis characteristics with respect to changes in the voltage of the output signal $S_{OUTM}$ in response to changes in the voltage of the input signal $S_{IN}$. Namely, the threshold voltage changing circuit 24 may be implemented simply by using a hysteresis circuit.

Furthermore, as illustrated in FIG. 1, in the level shifter 1 according to the present exemplary embodiment, the threshold voltage changing circuit 24 is configured including the constant current source IR3, the fifth transistor T5, and the sixth transistor T6. In the constant current source IR3, the input is connected to the first power source voltage $V_{BB}$. In the fifth transistor T5, the ninth main electrode is connected to the output of the constant current source IR3, the tenth main electrode is connected to the second power source voltage $V_{SS}$, and the fifth control electrode is connected to a node between the output terminal OUT, and the fourth main electrode the second transistor T2 and the fifth main electrode of the third transistor T3. The fifth transistor T5 is configured with n-channel conductivity. In the sixth transistor T6, the eleventh main electrode is connected to the fourth main electrode of the second transistor T2, the twelfth main electrode is connected to the fifth main electrode of the third transistor T3 and the output terminal OUT, and the sixth control electrode is connected to a node between the output of the constant current source IR3 and the ninth main electrode of the fifth transistor T5. The sixth transistor T6 is configured with p-channel conductivity. Thus, in the threshold voltage changing circuit 24, the permissible range of the threshold voltage (the voltage difference between the first threshold voltage and the second threshold voltage) is set by the ON-state resistance characteristics of the fifth transistor T5 and the sixth transistor T6. Accordingly, the level shifter 1 according to the present exemplary embodiment may enable variability in the permissible range to be lessened, and may improve switching precision of the output signal $S_{OUTM}$.

Further, in the level shifter 1 according to the present exemplary embodiment, the constant current source IR3 and the sixth transistor T6 are configured by offset transistors (offset MOSFETs), and the fifth transistor T5 is configured by a vertical diffused transistor (a VDMOSFET). These are both transistors with high withstand voltages. This enables level shifting from a high voltage power source (the first power source voltage $V_{BB}$) of a vehicle mounted battery installed in a vehicle such as an automobile to a low voltage (the third power source voltage $V_{CC}$) usable by an ECU or the like.

Furthermore, the level shifter 1 according to the present exemplary embodiment includes the clamp section 23 at a stage prior to the output terminal OUT of the level shifter section 2. The clamp section 23 limits the amplitude of the output signal $S_{OUTM}$. For example, the clamp section 23 limits the output signal $S_{OUTM}$ to 5.6 V or less. This may prevent damage and breakdown of the next-stage circuits (the buffer section 3) of the level shifter section 2, and may implement high reliability of the level shifter 1.

Further, in the level shifter 1 according to the present exemplary embodiment, the constant current source IR3 and the sixth transistor T6 of the threshold voltage changing circuit 24 are each configured by the same structures as the constant current sources IR1 and IR2 of the level shifter section 2. Likewise, the fifth transistor T5 of the threshold voltage changing circuit 24 is configured by the same structure as the third transistor T3 and the fourth transistor T4 of the level shifter section 2. Thus, the threshold voltage changing circuit 24 is configured using transistors already being used in the level shifter section 2 without needing new transistors, enabling the threshold voltage changing circuit 24 to be configured simply.

The present disclosure is not limited to the exemplary embodiment above and can be modified within a range not departing from the spirit thereof. For example, in the level shifter 1, the present disclosure may employ lateral diffused MOSFETs (LDMOSFETs) having lateral diffused structures as the transistors that construct the level shifter section 2 and the threshold voltage changing circuit 24. Furthermore, the circuit configuration of the buffer section above is not limited to the exemplary embodiment described above. For example, in the first inductor 31 of the buffer section 3, the eighth transistor T8 may be employed as a resistor.

What is claimed is:

1. A level shifter comprising:
a level shifter section that is driven by a first power source voltage, and that, in accordance with switching of an input signal of a voltage lower than the first power source voltage, switches an output signal that has been level-shifted, from the first power source voltage to a voltage lower than the first power source voltage; and
a threshold voltage changing circuit that, in accordance with a switching direction of the input signal, changes a threshold voltage of the input signal for switching the output signal,
wherein the level shifter section includes a differential amplifier circuit and a current mirror circuit, and
wherein the threshold voltage changing circuit includes:
a constant current source having an input connected to the first power source voltage;
a first transistor having a first electrical conductivity type and having a first main electrode connected to an output of the constant current source, a second main electrode connected to a second power source voltage having a voltage lower than the first power source voltage, and a first control electrode connected to a node between an output terminal where the output signal is output and the differential amplifier circuit; and
a second transistor having a second electrical conductivity type opposite to that of the first electrical conductivity type and having a third main electrode connected to the differential amplifier circuit, a fourth main electrode connected to the differential amplifier circuit and the output terminal, and a second control electrode connected to a node between the output of the constant current source and the first main electrode.

2. The level shifter of claim 1, wherein the threshold voltage changing circuit is a hysteresis circuit exhibiting hysteresis characteristics with respect to changes in a voltage of the output signal in response to changes in the voltage of the input signal.

3. The level shifter of claim 1, wherein
the differential amplifier circuit includes:
a third transistor having a fifth main electrode connected to the first power source voltage, a sixth main electrode connected to the second power source voltage, and a third control electrode connected via a resistor to an input terminal to which the input signal is input,
a fourth transistor having a seventh main electrode connected to the first power source voltage and an eighth main electrode connected to a fourth control electrode of the fourth transistor and to the output terminal, and
a fifth transistor having the first electrical conductivity type and having a ninth main electrode connected to the eighth main electrode and the output terminal and a tenth main electrode connected to the second power source voltage; and
the current mirror circuit includes:
the fifth transistor, and
a sixth transistor having the first electrical conductivity type and having an eleventh main electrode connected to the first power source voltage, a twelfth main electrode connected to the second power source voltage, and a sixth control electrode connected to a fifth control electrode of the fifth transistor.

4. The level shifter of claim 1, wherein:
the constant current source and the second transistor are configured by an offset transistor, and
the first transistor is configured by a vertical diffused transistor.

5. The level shifter of claim 1, further comprising a clamp section that limits the amplitude of the output signal.

* * * * *